United States Patent
Breitwisch et al.

(10) Patent No.: US 6,778,449 B2
(45) Date of Patent: Aug. 17, 2004

(54) METHOD AND DESIGN FOR MEASURING SRAM ARRAY LEAKAGE MACRO (ALM)

(75) Inventors: Matthew J. Breitwisch, Essex Junction, VT (US); Jeffrey S. Brown, Middlesex, VT (US); Randy W. Mann, Jericho, VT (US); Jeffrey H. Oppold, Richmond, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/064,302

(22) Filed: Jul. 1, 2002

(65) Prior Publication Data

US 2004/0001376 A1 Jan. 1, 2004

(51) Int. Cl.[7] .................................................. G11C 7/00
(52) U.S. Cl. ......................................... 365/201; 365/154
(58) Field of Search ................................. 365/201, 154, 365/226, 190; 324/765

(56) References Cited

U.S. PATENT DOCUMENTS

| | | | |
|---|---|---|---|
| 4,685,086 A | 8/1987 | Tran | |
| 4,860,261 A | 8/1989 | Kreifels et al. | |
| 5,132,929 A * | 7/1992 | Ochii | 365/201 |
| 5,255,230 A * | 10/1993 | Chan et al. | 365/201 |
| 5,260,906 A * | 11/1993 | Mizukami | 365/201 |
| 5,331,594 A * | 7/1994 | Hotta | 365/201 |
| 5,659,511 A | 8/1997 | Huang | |
| 5,732,015 A | 3/1998 | Kazerounian et al. | |
| 5,898,186 A * | 4/1999 | Farnworth et al. | 257/48 |
| 5,936,902 A | 8/1999 | Hsu et al. | |
| 5,994,915 A * | 11/1999 | Farnworth et al. | 324/765 |
| 6,259,623 B1 | 7/2001 | Takahashi | |
| 6,297,999 B2 * | 10/2001 | Kato et al. | 365/201 |
| 6,392,941 B1 * | 5/2002 | Churchill | 365/201 |

* cited by examiner

Primary Examiner—Gene N. Auduong
(74) Attorney, Agent, or Firm—McGinn & Gibb, PLLC; Mark F. Chadurjian, Esq.

(57) ABSTRACT

A method and structure for a test structure that has an array of cells connected together by conductive lines. The conductive lines connect the cells together as if they were a single cell. The conductive lines can include common word line; a common bit line; a common bit line complement line, a common N-well voltage line, a common interior ground line, a common interior voltage line, and/or a common ground line.

17 Claims, 4 Drawing Sheets

METHOD AND DESIGN FOR MEASURING SRAM ARRAY LEAKAGE MACRO (ALM)

BACKGROUND OF THE INVENTION

1. Field of the Invention

The present invention generally relates to systems and methods of detecting electrical leakage current from an array of semiconductor devices and more particularly to a system and method that improves the ability to measure components of leakage current.

2. Description of the Related Art

Static random access memory (SRAM) is a commonly used memory device. When the power source supplied to SRAM is shut down, the data stored in SRAM disappears. The memory cells in SRAM are used to store data by changing the conduction state of the internal transistors in a memory cell. Once the data is written into the SRAM cell, the internal latch maintains the data state as long as power is supplied to the array. This is quite different from dynamic RAM (DRAM) which stores data by charging and discharging capacitors and must be frequently refreshed. Because SRAM does not require refresh and the read and write speed of SRAM is very fast so it is widely applied to computer systems.

With component arrays, such as memory arrays (SRAM arrays), the issue of standby power consumption is especially important for battery driven applications. An important factor of power consumption with large SRAM arrays is leakage current. Therefore, it is important to test memory arrays for leakage to evaluate whether a new design reduces leakage, as well as to determine whether the array was manufactured properly (without defects).

Conventional systems that test for current leakage do not allow sufficient flexibility for leakage component learning and often do not allow one to fully understand the leakage component of the full SRAM array and cell contribution. There is a need to increase the accuracy and flexibility of the current leakage detection methods. The invention described below provides systems/methods that dramatically increase the ability to detect and characterize the leakage current from memory arrays.

BRIEF SUMMARY OF THE INVENTION

In view of the foregoing and other problems, disadvantages, and drawbacks of the conventional current/voltage leakage detection systems the present invention has been devised, and it is an object of the present invention to provide a structure and method for an improved current/voltage leakage detection system.

In order to attain the object(s) suggested above, there is provided, according to one aspect of the invention, a test structure that has an array of cells connected together by conductive lines. The conductive lines connect the cells together as if they were a single cell. The conductive lines can include a common word line, a common bit line, a common bit line complement line, a common N-well voltage line, a common interior ground line, a common interior voltage line, and/or a common ground line.

Each of the conductive lines can include an individual test pad. By connecting to each test pad, the array can be tested for current leakage as if the array were an individual cell. Each word line contact pad is connected to the common word line. A bit line contact pad is connected to the common bit line. The invention also has a bit line complement contact pad that is connected to a common bit line complement line. A voltage contact pad is connected to a N-well voltage line. An interior ground contact pad is connected to a common interior ground line. An interior voltage contact pad is connected to the common interior voltage line and a ground line contact pad is connected to a common ground line.

The conductive lines join all word lines within the array as a single word line. The invention joins all bit lines within the array as a single bitline. The invention joins all voltage lines within the array as a single voltage line and also joins all ground lines together within the array as a single ground line.

The invention applies a voltage level to one conductive line to charge all the elements connected to that conductive line. The invention measures the current on one conductive line to determine the average value for all the elements connected to that conductive line.

The invention also tests an array structure by using conductive lines to connect cells within the array. First, the invention joins all word lines within the array as a single word line. Next, the invention joins all true and complement bit lines within the array as either a single true or complement bitline. The invention joins all voltage lines within the array as a single voltage line and then joins all ground lines together within the array as a single ground line. The invention then places an applied voltage on one or more of the conductive lines and measures the current leakage on the other conductive lines. The invention joins the voltage lines and joins all N-wells to a single voltage line. The invention joins all interior voltages of the cells to a single interior voltage line. The joining of the ground lines includes forming a connection to a substrate of the array and joining all interior grounds of the cells to a single interior ground line. The invention applies a voltage to one conductive line to charge all elements connected to the conductive line. The invention then measures the current on the conductive line to measure a leakage at a given applied voltage on all elements connected to that conductive line.

BRIEF DESCRIPTION OF THE SEVERAL VIEWS OF THE DRAWINGS

The foregoing and other objects, aspects and advantages will be better understood from the following detailed description of a preferred embodiment(s) of the invention with reference to the drawings, in which.

DETAILED DESCRIPTION OF THE INVENTION

As mentioned above, conventional current leakage detection macros need to be improved to increase the content of information that can be obtained from the current leakage measurement. One method for obtaining SRAM array leakage involves providing a separate array power supply input. The current drawn by such an input location captures only a component of the total array current. The component of power drawn by the bitlines, which includes diffusion leakage, subthreshold current and GIDL is not captured in this method. For example, conventional current leakage detection macros only observe the ground plane or voltage source in an attempt to detect current leakage from the array. However, by measuring only these contacts, many other current leakage mechanisms are ignored. The inventors realized that various defect mechanisms may contribute to the SRAM cell or array leakage. More specifically, the inventors identified five additional parametric leakage mechanisms, including device off current, GIDL (gate induced drain current), n+ to N-well punchthrough current, gate oxide tunnel current, and reverse bias diffusion leakage current. Each of these additional mechanisms may involve several factors such as diffusion leakage, which has area and perimeter components. It is further realized that measurements taken from a single SRAM cell can be problematic for several reasons. First, the cell sizes are becoming extremely small and it is difficult to obtain reliable low current values. Second, because of process and parametric variations across the entire array, obtaining a single cell value may not accurately reflect the average of the whole array, thus making it necessary to make many single cell measurements which would be costly.

Figure 1:
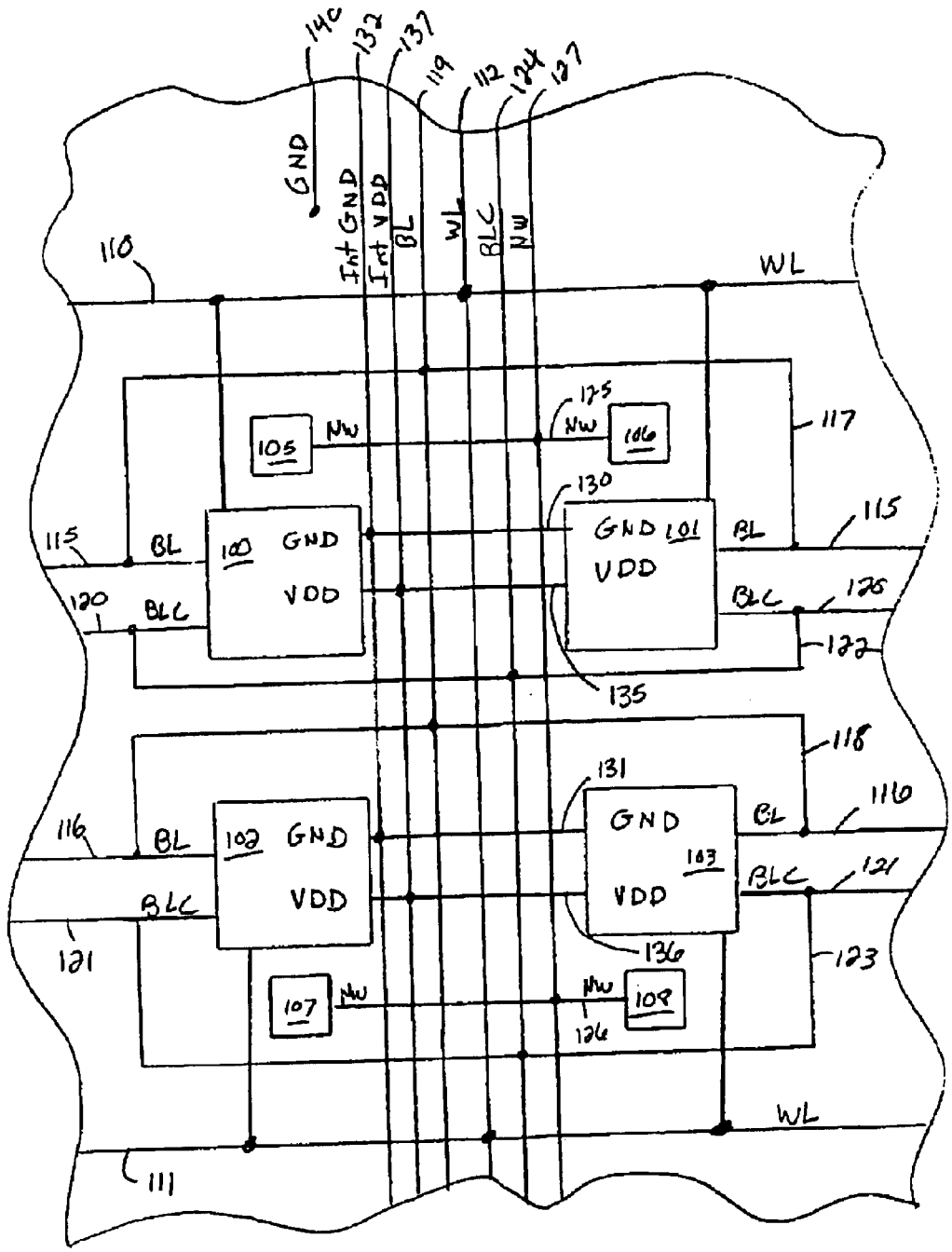
FIG. 1 is a schematic diagram of a portion of a memory array according to the invention.

FIG. 1 illustrates a portion of a memory array that utilizes the invention to detect current leakage. The examples shown in FIG. 1 is an SRAMs array having cell elements 100–103. However, the invention is not limited to and SRAM array, but instead is applicable to any similar array of elements for which the leakage current needs to be strictly detected and controlled. In FIG. 1, each of the memory cells 100–103 has an associated N-well 105–108. In addition, word lines 110, 111; bit line 115, 116; and bit line compliments 120, 121 are connected to each of the memory cells 100–103.

Further, while one possible wiring scheme in shown in the drawings, one ordinarily skilled in the art would understand that many different wiring schemes could be utilized to form the connections necessary. The conductive common wires that are formed with the invention vary depending upon the technology involved and the specific implementation of that technology within a given design. Therefore, the invention is not limited to the specific wiring patterns shown in the drawings.

The invention wires together all cells within the array to allow the cells to be testable as if they were a single cell. More specifically, within the array, all bit lines, word lines, N-wells, interior grounds, and interior voltages are wired in common to enable the array to be characterized for different components of leakage.

As shown in FIG. 1, the N-wells 105–108 are connected to a common N-well line 127 by connecting lines 125, 126. Similarly, bit line complement lines 120, 121 are connected to a common bit line complement line 124 by connecting lines 122, 123. Also, the bit lines 115, 116 are connected to a common bit line 119 by connecting lines 117, 118. Further, word lines 110, 111 are connected to a common word line 112. Each of the cells 100–103 includes an interior ground component (GND) and an interior voltage component (VDD). The ground component is connected to a common interior ground line 132 by connecting lines 130, 131; and the interior voltage component is connected to a common interior voltage line 137 by connecting lines 135, 136. In addition, the invention includes a ground line 140 connected to the substrate.

Figure 2:
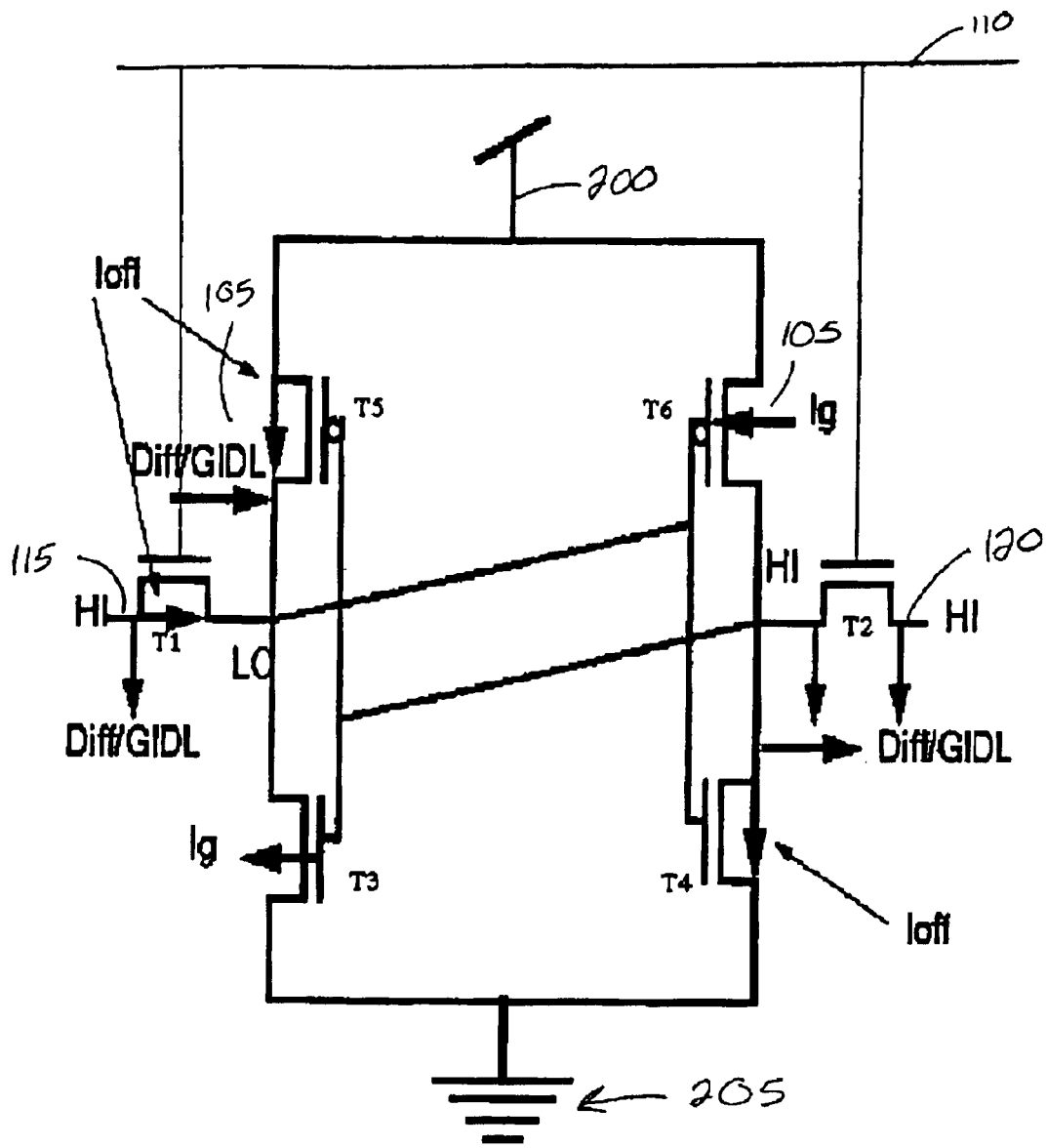
FIG. 2 is a schematic diagram of an individual memory cell according to the invention.

FIG. 2 illustrates one of the memory cells 100–103 in greater detail. The word line is shown as item 110, the bit line is shown as item 115, the bit line complement line is shown as item 120, and the N-well is shown as item 105. The interior ground is shown as item 205 and the interior voltage is shown as item 200. The cell comprises cross-couple transistors T3–T6 as well as transistors T1 and T2. The SRAM cell shown schematically in FIG. 2 illustrates several of the dominant leakage paths operating in the cell when it is in standby mode, i.e., not being written or read. For illustrative purposes, the cell is latched in a given state as shown in FIG. 2. It follows from this configuration that there are three transistors where the subthreshold leakage mechanism is actively contributing to the array standby leakage. In the example given in FIG. 2, the internal node transistors T4 (NFET) and T5 (PFET) and the wordline transistor T1 (NFET) are being held in the off state and have a drain to source voltage of Vdd.

Figure 3:
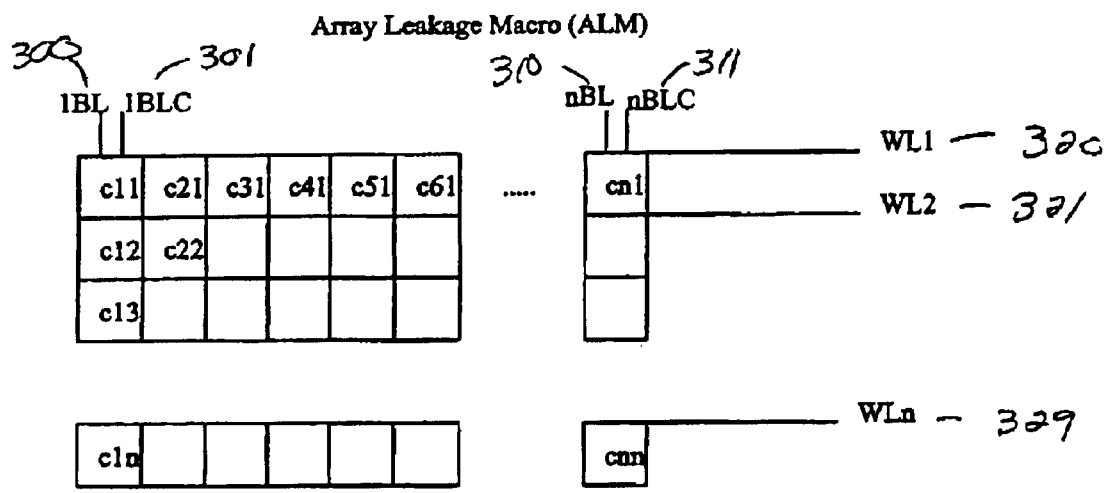
FIG. 3 is a schematic diagram of a portion of a memory array according to the invention.

FIG. 3 is a schematic diagram of memory cells (c11–c1n) within an array, bitlines 300, 310, bitline complement lines 301, 310, word lines 320, 321, 329. FIG. 3 illustrates schematically how the array of cells would be physically wired out to the external probe pads.

Figure 4:
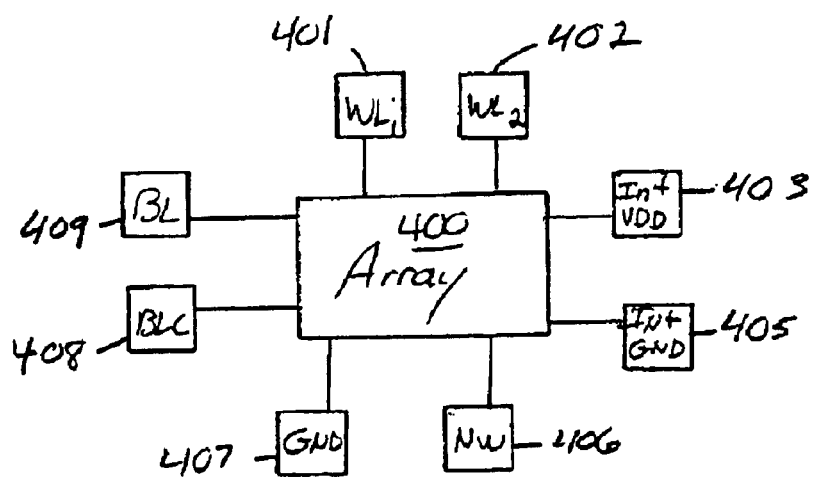
FIG. 4 is a schematic diagram illustrating the various contact pads surrounding an array used with the invention.

A feature of the invention is that, for an entire array, single distinct, unique contact pads are provided for each of the components being measured. Therefore, as shown in FIG. 4, the invention includes a single bitline contact pad 409 for all bit lines within an array 400. Similarly, the invention includes distinct contact pads for all the bit line complement lines (408), the ground (407), all the N-wells showing VDD (406), all the interior grounds (405), all the interior voltages (403), as well as multiple pads 401, 402 for all word lines. The wordline contact scheme can be done by either a single contact where all wordlines are tied together or by wiring out the adjacent wordlines to different pads which can provide some additional leakage/defect information.

Figure 5:
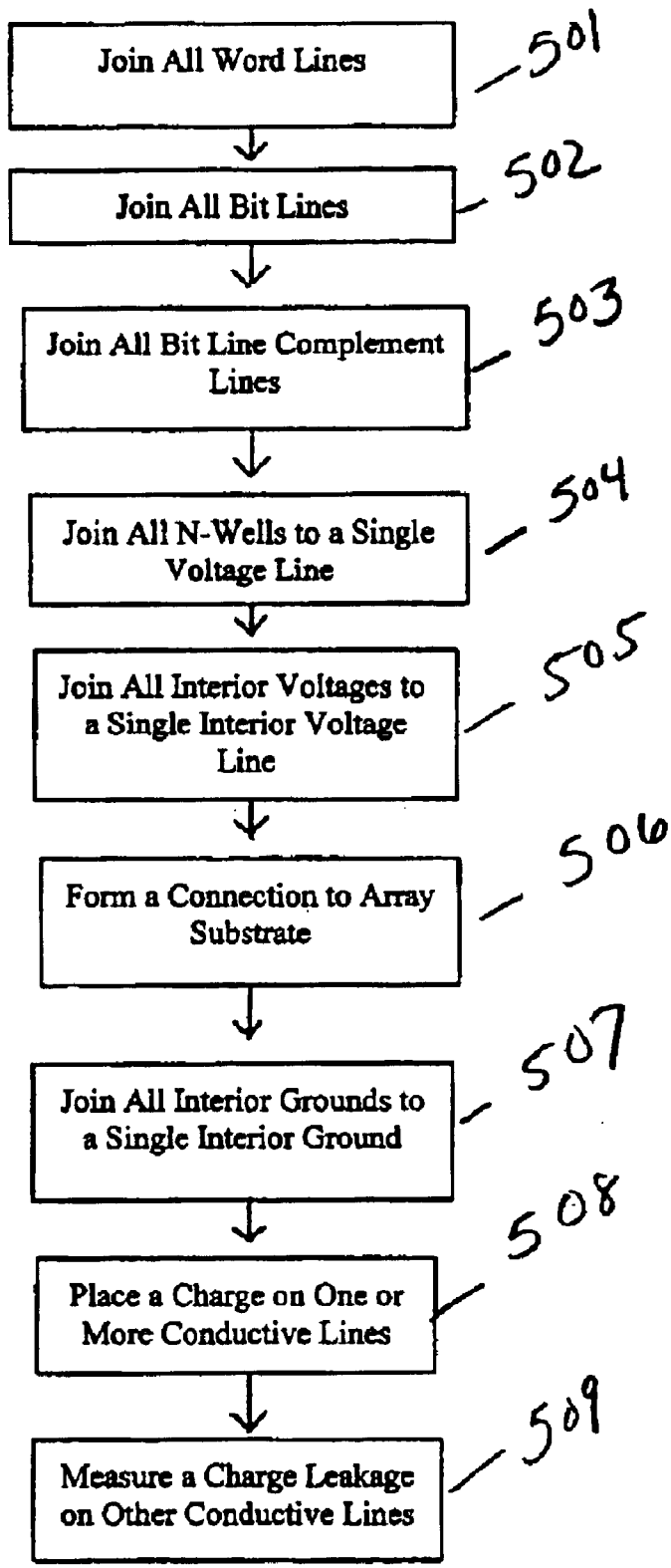
FIG. 5 is in flowchart showing the processing of the invention.
Figure 1:
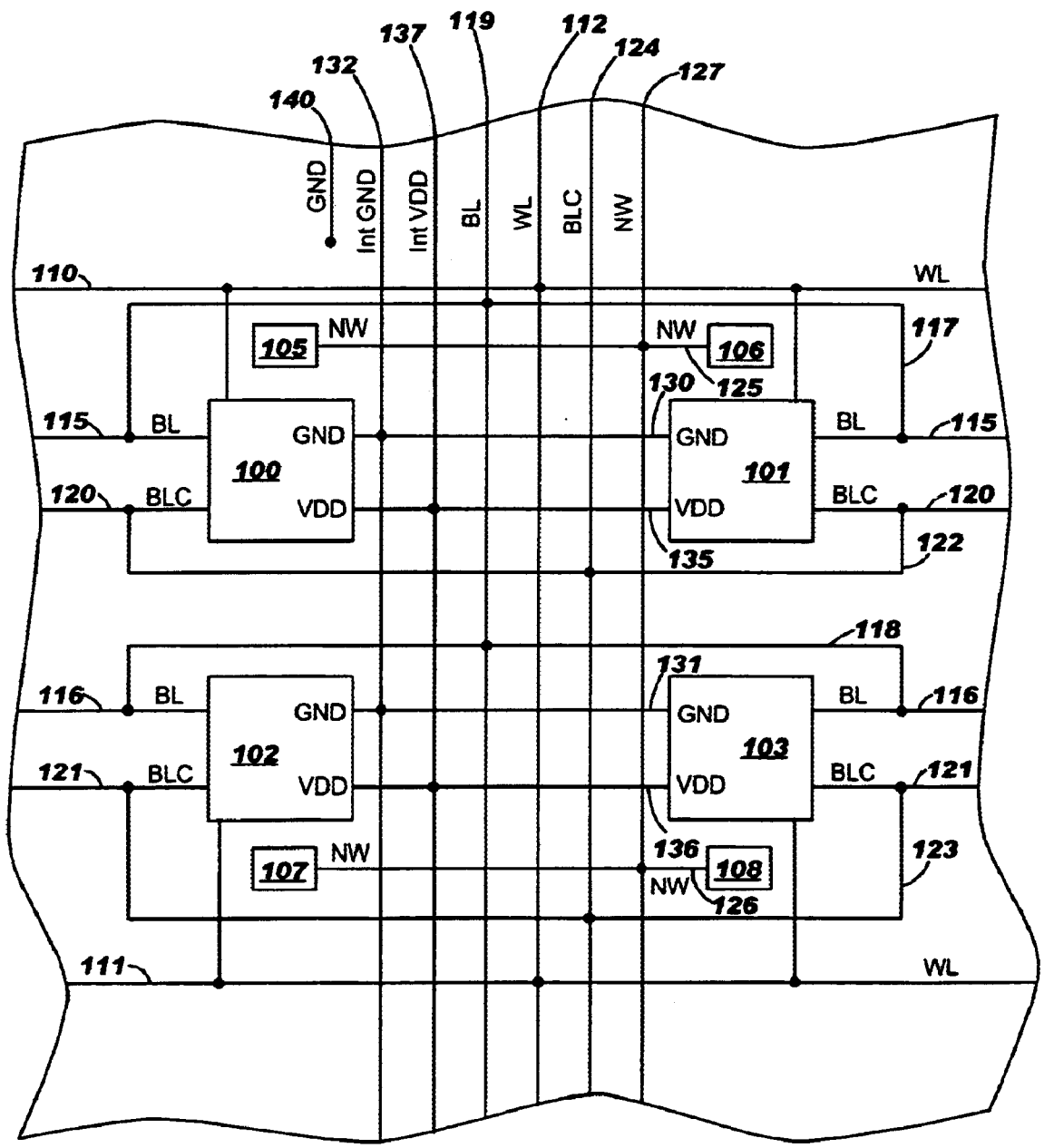
Figure 2:
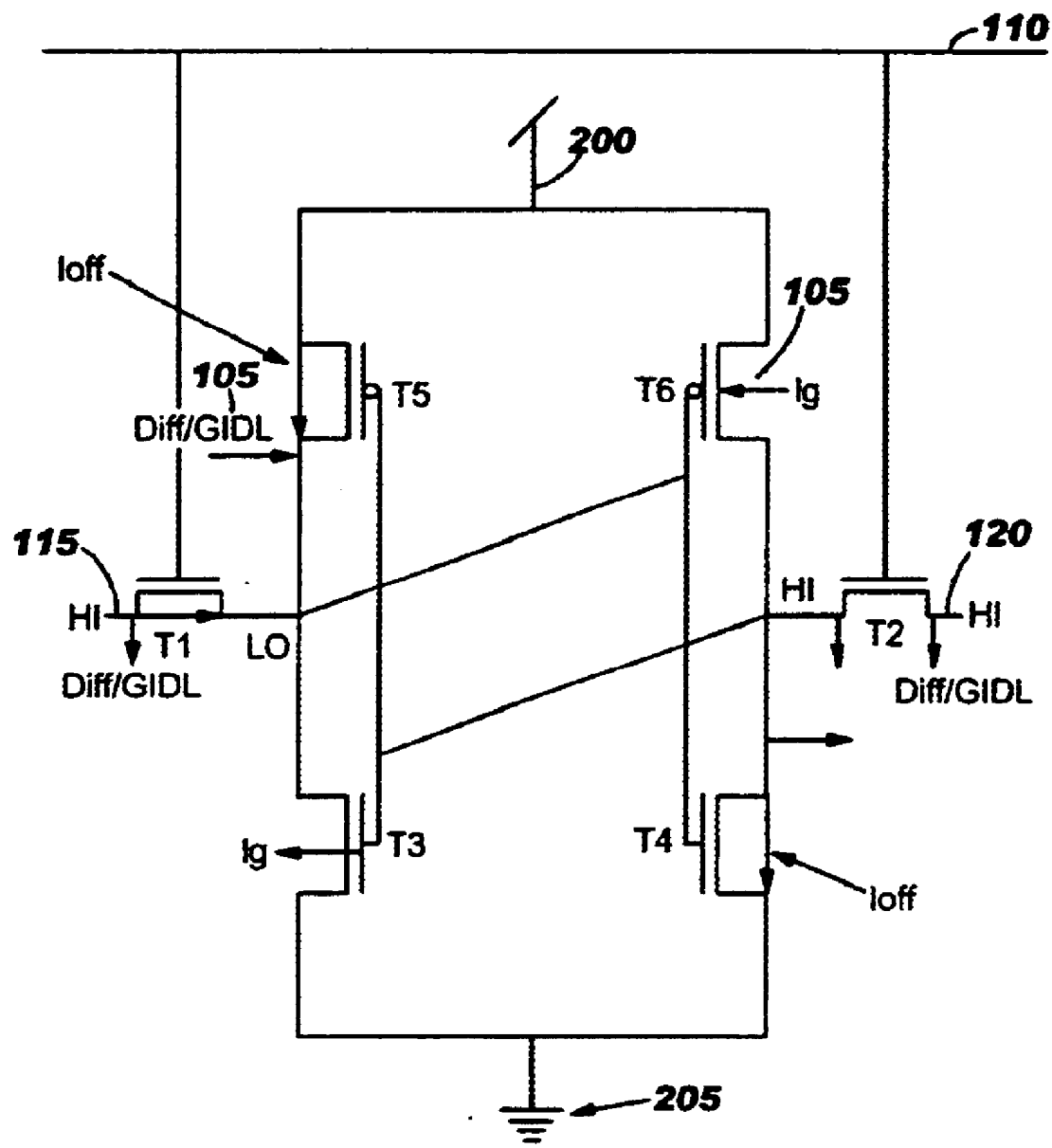
Figure 3:
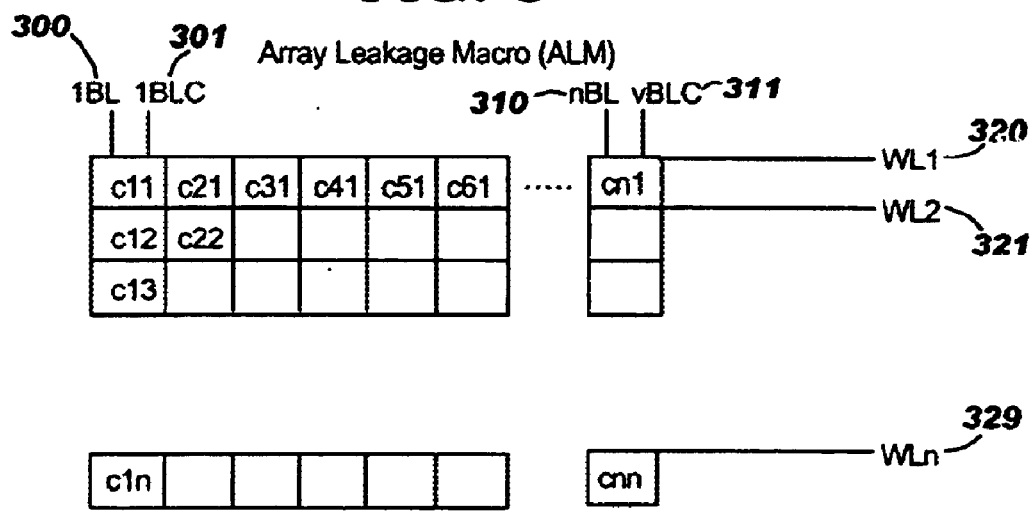
Figure 4:
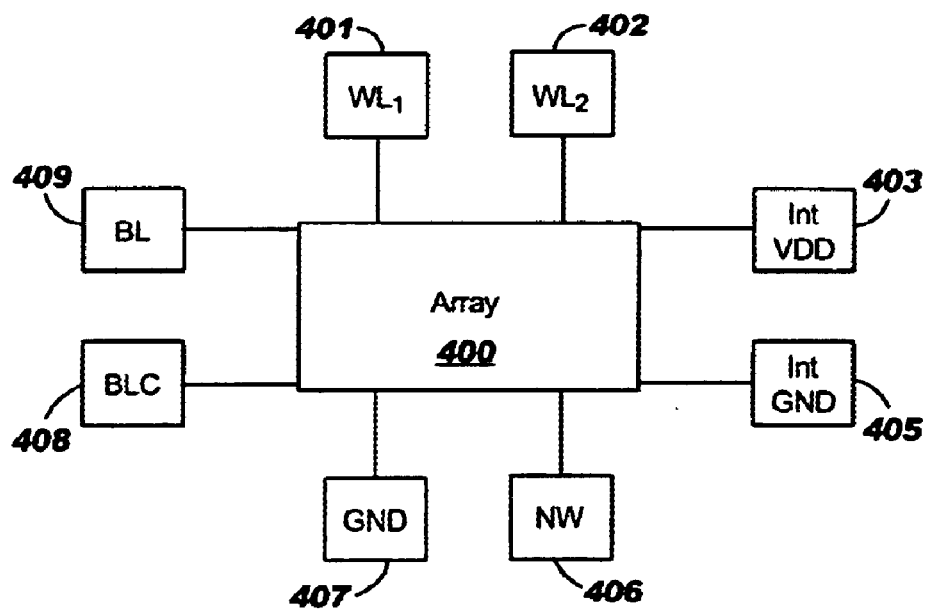
Figure 5:
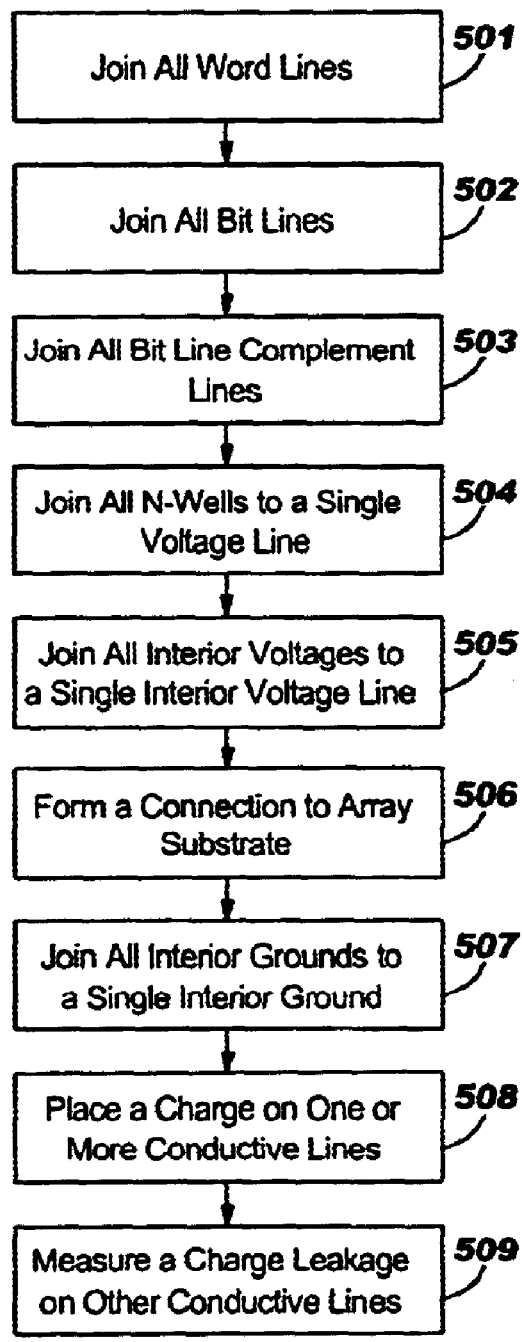

FIG. 5 is a flowchart shows the process of the invention. First, in item 501, the invention joins all word lines within a single word line. In item 502, the invention joins all bit lines within said array as a single bitline. The invention joins all bit line complement lines within said array as a single bitline complement line in item 503. Next, in item 504, the invention joins all N-wells to a single voltage line. In item 505, the invention joins all interior voltages to a single interior voltage line. The invention forms a connection to the array substrate in item 506. In item 507, the invention joins all interior grounds of the cells to a single interior ground line. The invention places a charge on one or more of the conductive lines in item 508. Lastly, in item 509, the invention measures a charge leakage on other conductive lines.

Using the foregoing connections allows the entire array to be evaluated as a single cell. Therefore, for example, a charge can be placed upon any of the common lines while the other lines are observed to determine whether current leakage occurs within any of the cells with in the array. While no individual cell can be addressed uniquely, there are several important elements that can be learned. One is the lowest array leakage value, from the natural unwritten state. Another is the leakage variation with all cells written as a one and the leakage delta with all cells written as a zero.

While a number of common conductive lines are discussed above, the invention is not limited to these specific conductive lines, nor is it required to have all the common conductive line shown above. As discussed previously, the SRAM array is used above merely as an example. Therefore, if different types of arrays of elements were utilized, one ordinarily skilled in the art would understand that different conductive lines would be formed to test different elements within each cell. Therefore, the invention is not limited to the specific structure shown above. To the contrary, the invention is applicable to all array structures that need to be test for current leakage. The invention allows common elements within each of the arrays to be connected in common to allow all such elements to be tested for current leakage simultaneously.

With respect to SRAM arrays, one ordinarily skilled in the art would understand that there are a number of different test procedures that could be utilized to evaluate current leakage. For example, one possible implementation of the invention includes a contact pad for all voltages (interior voltage and N-wells), another for the grounds (interior ground and substrate ground), another for the bit line, one more for the bit line complement, and an additional common line for the word lines. Alternatively, as shown in FIG. 4 above, each of the separate conductive lines can include its own contact pad.

One possible method for evaluating leakage with the invention could initialize the array by setting all bit lines high and all bit line compliments low, using the common lines discussed above. The remaining conductive lines could then be measured to determine the amount of current leaking in these regions. This would measure total standby current.

For bit line leakage testing, both the bit line and bit line complement could be set to a high-value, while the word lines and interior grounds are set to a low value. Current leaking on the remaining lines would indicate bit line leakage. In addition, the invention can measure bit line gate induced drain leakage by setting the bit line and bit line complement high while setting the word line and interior ground low. Current on the interior ground lines would indicate the gate induced drain leakage. Another possible test used with the invention isolates the subthreshold current of the word line device. This test sets the bit line high and the bit line complement low. The word line is then taken from a high position to a low position. The current that appears on the remaining common lines would indicate subthreshold current leakage.

To measure the interior voltage current (N-well current), the invention can be used by setting the bit line high and bit line complement low, to allow the interior voltage current to be measured. In a similar manner, the exterior VDD voltage, interior voltage and interior ground can be tested using the same charging scenario by measuring current leakage on each of the common lines connected to the interior voltage, exterior voltage, interior ground, etc.

The invention has proven to be more reliable and easier to use than previous methods. It also provides flexibility in comparing array leakage for known written states versus random. While the invention has been described in terms of preferred embodiments, those skilled in the art will recognize that the invention can be practiced with modification within the spirit and scope of the appended claims.

What is claimed is:

1. A test structure comprising:
    an array of cells; and
    conductive lines connecting said cells together,
    wherein maid conductive lines connect said cells together as if they were a single cell,
    wherein said array of cells comprises a plurality of memory cells, word lines, bit lines, voltage lines, and ground lines, and wherein said conductive lines:
    join all word lines within said array as a single word line;
    join all bit lines within said array as a single bitline;
    join all voltage lines within said array as a single voltage line; and
    join all ground lines together within said array as a single ground line.

2. The test structure in claim 1, wherein said conductive lines comprise at least one of:
    a common word line;
    a common bit line;
    a common bit line complement line;
    a common N-well voltage line;
    a common interior ground line;
    a common interior voltage line; and
    a common ground line.

3. The test structure in claim 2, further comprising at least one of:
    a word line contact pad connected to said common word line;
    a bit line contact pad connected to said common bit line;
    a bit line complement contact pad connected to said common bit line complement line;
    a voltage contact pad connected to said common N-well voltage line;
    an interior ground contact pad connected to said common interior ground line;
    an interior voltage contact pad connected to said common interior voltage line; and
    a ground line contact pad connected to said common ground line.

4. The test structure in claim 1, wherein each of said conductive lines includes an individual test pad, wherein by connecting to each said test pad, said array can be tested for current leakage as if said array were an individual cell.

5. The test structure in claim 1, wherein applying a voltage to one conductive line of said conductive lines charges all elements connected to said conductive line within said array.

6. The test structure in claim 5, wherein measuring a current on one conductive line of said conductive lines measures an average current on all elements connected to said conductive line within said array.

7. A test structure comprising an array of cells connected together by conductive lines, wherein said conductive lines connect said cells together as if they were a single cell, said conductive lines comprising:
    a common word line;
    a common bit line;
    a common bit line complement line;
    a common N-well voltage line;
    a common interior ground line;
    a common interior voltage line; and
    a common ground line.

8. The test structure in claim 7, wherein said conductive lines:
    join all word lines within said array as a single word line;
    join all bit lines within said array as a single bitline;
    join all voltage lines within said array as a single voltage line; and
    join all ground lines together within said array as a single ground line.

9. The test structure in claim 7, wherein each of said conductive lines includes an individual test pad, wherein by connecting to each said test pad, said array can be tested for current leakage as if said array were an individual cell.

10. The test structure in claim 7, further comprising at least one of:
   a word line contact pad connected to said common word line;
   a bit line contact pad connected to said common bit line;
   a bit line complement contact pad connected to said common bit line complement line;
   a voltage contact pad connected to said common N-well voltage line;
   an interior ground contact pad connected to said common interior ground line;
   an interior voltage contact pad connected to said common interior voltage line; and
   a ground line contact pad connected to said common ground line.

11. The test structure in claim 7, wherein applying a voltage to one conductive line of said conductive lines charges all elements connected to said conductive line within said array.

12. The test structure in claim 11, wherein measuring a leakage current on one conductive line of said conductive lines measures an average leakage current on all elements connected to said conductive line within said array.

13. A method of testing an array structure using conductive lines to connect cells within said array, said method comprising:
joining:
   all word lines within said array as a single word line;
   all bit lines within said array as a single bitline;
   all voltage lines within said array as a single voltage line; and
   all ground lines together within said array as a single ground line;
   placing a charge on one or more of said conductive lines; and
   measuring a charge leakage on others of said conductive lines.

14. The method in claim 13, wherein measuring current on one conductive line of said conductive lines measures an average leakage current on all elements connected to said conductive line within said array.

15. The method in claim 13, wherein said joining of said voltage lines includes:
   joining all N-wells to a single voltage line; and
   joining all interior voltages of said cells to a single interior voltage line.

16. The method in claim 13, wherein said joining of said ground lines includes:
   forming a connection to a substrate of said array; and
   joining all interior grounds of said cells to a single interior ground line.

17. The method in claim 13, wherein applying a voltage to one conductive line of said conductive lines charges all elements connected to said conductive line within said array.

* * * * *

UNITED STATES PATENT AND TRADEMARK OFFICE
CERTIFICATE OF CORRECTION

PATENT NO. : 6,778,449 B2
DATED : August 17, 2004
INVENTOR(S) : Breitwisch et al.

It is certified that error appears in the above-identified patent and that said Letters Patent is hereby corrected as shown below:

Drawings,
Please substitute Figs. 1-5 with the attached formal drawings of Figs. 1-5.

Signed and Sealed this

Twenty-third Day of August, 2005

JON W. DUDAS
*Director of the United States Patent and Trademark Office*